United States Patent [19]

Hayashi et al.

[11] Patent Number: 5,436,505
[45] Date of Patent: Jul. 25, 1995

[54] HEAT-RESISTING OHMIC CONTACT ON SEMICONDUCTOR DIAMOND LAYER

[75] Inventors: Kazushi Hayashi; Takeshi Tachibana, both of Kobe, Japan

[73] Assignee: Kabushiki Kaisha Kobe Seiko Sho, Kobe, Japan

[21] Appl. No.: 189,608

[22] Filed: Feb. 1, 1994

[30] Foreign Application Priority Data

Feb. 9, 1993 [JP] Japan .................. 5-021530

[51] Int. Cl.⁶ .................. H01L 23/48; H01L 29/40
[52] U.S. Cl. .................. 257/763; 257/77; 257/764; 257/770; 437/192
[58] Field of Search .................. 257/77, 763, 764, 770; 437/192, 200

[56] References Cited

U.S. PATENT DOCUMENTS

| | | | |
|---|---|---|---|
| 4,990,994 | 2/1991 | Furukawa et al. | 257/77 |
| 5,043,773 | 8/1991 | Precht et al. | 257/77 |
| 5,132,749 | 7/1992 | Nishibayashi et al. | 257/77 |
| 5,144,380 | 9/1992 | Kimoto et al. | 257/77 |
| 5,243,199 | 9/1993 | Shiomi et al. | 257/77 |
| 5,278,431 | 1/1994 | Das | 257/77 |
| 5,313,101 | 5/1994 | Harada et al. | 257/763 |

FOREIGN PATENT DOCUMENTS

| | | | |
|---|---|---|---|
| 0269019 | 6/1988 | European Pat. Off. | 257/763 |
| 0098968 | 6/1983 | Japan | 257/763 |
| 2243949 | 11/1991 | United Kingdom | 257/77 |
| 2253943 | 9/1992 | United Kingdom | 257/77 |

*Primary Examiner*—Rolf Hille
*Assistant Examiner*—David Ostrowski
*Attorney, Agent, or Firm*—Oblon, Spivak, McClelland, Maier, & Neustadt

[57] ABSTRACT

Disclosed is a heat-resistant ohmic contact formed on a semiconducting diamond. It has a contact Ti layer having a thickness of 10 to 70 Å and a carbide layer generated by the reaction between the Ti layer and the semiconducting diamond layer. A diffusion prevention layer composed of at least one kind material selected from a group consisting of refractory metals including W, Mo, Au, Pt and Ta, refractory alloys including Ti-W, and refractory compounds including TiC and TiN is formed on the contact Ti layer. With this construction, the diffusion and the oxidation of Ti can be prevented.

4 Claims, 6 Drawing Sheets

HEAT-RESISTING OHMIC CONTACT ON SEMICONDUCTOR DIAMOND LAYER

BACKGROUND OF THE INVENTION

1. Field of the Invention

The present invention relates to a heat-resisting ohmic contact formed on a semiconducting diamond layer which is used for electronic parts or electronic devices such as diodes, transistors, FETs and thermistors, and to a process for forming the same.

2. Description of the Related Art

Diamond is an electrically insulating material having high hardness, and excellent thermal and chemical stability and radiation hardness. It has been studied with a view to, and has been adopted in various industrial applications. Meanwhile, diamond has a wide band gap of about 5.4 eV, and exhibits semiconducting properties upon doping with impurities such as Boron (B). The semiconducting diamond thus doped with impurities is expected to be applicable for high temperature use.

Methods of diamond films having such excellent properties using plasma reaction in vapor phase have been established. These have promoted the development of devices incorporating diamond films, for example, tool coating, speaker diaphragms, heat sinks for semiconductor devices, and electronic devices such as diodes and transistors.

In the electronic devices using semiconducting diamonds, ohmic contacts which are excellent in adhesiveness with the semiconducting diamond layers, that is, contacts with a linear current-voltage characteristic, must be formed. Taking into account the characteristic use of diamond at high voltages and high temperatures, the contact is required to be small in its contact resistance, and to be stable at temperatures higher than the service temperature. This is because a high contact resistance tends to cause the generation of heat at the contact area, resulting in a further localised increase in temperature.

Methods of fabricating ohmic contacts on semiconducting diamond layers have been proposed by A.T. Collins et al. (Diamond Research, pp. 19–22. 1970) and K.L. Moazed et al. (J. Appl. Phys., vol. 68, No. 5, pp. 2246–2255, 1990). Namely, as described in these references, there has been known a method of obtaining an ohmic contact by forming a layer of Ta, Ti, Mo or other element liable to form a carbide, followed by electron beam irradiation or vacuum heat treatment.

The above method is carried out as follows: Namely, as shown in FIG. 4a, a carbide layer 2 is formed at an interface between a diamond layer 3 on a substrate and a metal contact layer 1 made from Ta, Ti, Mo or the like, to thus obtain a preferable ohmic contact. In other words, a metal such as Ta, Ti, Mo or the like is used as a contact material, and the carbide layer 2 is formed between the contact layer 1 and a diamond layer 3.

On the other hand, in recent years, a method using a multi-layer metal film has been reported wherein Ti, which forms the most stable carbide $TiC_{1-x}$ (where $0 < X < 1$) is used as the contact material, and Au, Pt or Mo/Au (Mo and Au are layered in this order) is formed on the Ti contact for preventing the oxidation of Ti.

In an ohmic contact shown in FIG. 4b, a contact Ti layer 1 is formed on a substrate composed of a semiconducting diamond layer 3 and a diffusion preventive Au layer 4 is formed on the contact Ti layer 1.

In an ohmic contact shown in FIG. 4c, a diffusion prevention Mo layer 5 is formed on a contact Ti layer 1 on a semiconducting diamond layer 3, and further a diffusion prevention Au layer 4 is formed on the diffusion prevention Mo layer 5. The semiconductor devices using this multi-layer contact of Ti/Mo/Au include thermistors etc. (Fujimori et al., NEW DIAMOND Vol. 13, P32, 1989).

Ti is generally used as the material for an ohmic contact: however, it has a high chemical reactivity and is liable to be oxidized at high temperatures in air. Accordingly, as described above, for preventing the oxidation of Ti, a multi-layer film including Au, Pt, Mo/Au or the like as an oxidation prevention layer is used.

With use over a long period, however, it is difficult to perfectly shield the contact from oxygen. Actually, under the condition shown in Table 1, the contact composed of a contact Ti layer 1/diffusion prevention Au layer 4 shown in FIG. 4b was fabricated, and was examined for oxidation prevention performance.

FIG. 5a shows the distribution of each element in the depth direction as measured by X-ray photoelectron spectroscopy. In this graph, the ordinate indicates a ratio of the atomic concentration of each element (atomic %), and the abscissa indicates the sputtering time corresponding to the distance from the surface of the contact. As can be seen in FIG. 5a, as one moves from the surface of the contact, the layers are arranged in the following order; Au, Ti, diamond (C).

The contact was next kept for 60 min at 500° C. in air, which gave the result shown in FIG. 5b. As can be seen in FIG. 5b, Ti had diffused to the surface and oxidized to form $TiO_2$. The reason for this is as follows: namely, the carburization of Ti is started on the surface of the diamond by annealing of the sample, when forming the ohmic contact; however, at the same time, the contact material Ti diffuses through the Au layer 4 formed on the Ti layer and reacts with the oxygen on the surface of the contact, and is oxidized.

TABLE 1

| formation condition | Ti layer | Au layer |
| --- | --- | --- |
| DC discharge condition | 0.8 A, 380 V | 0.2 A, 510 V |
| film deposition time | 15 sec | 1 min |
| film thickness | 400 Å | 2000 Å |
| gas pressure | | 2 mTorr |
| discharge gas | | Ar |

Next, a Ti/Mo/Au contact, in which an Mo layer 5 for preventing the diffusion of Ti was inserted between a Ti layer 1 and an Au layer 4, was fabricated (see FIG. 4c). Table 2 shows the film formation conditions. Further, FIG. 6a shows the concentration distribution of elements in the depth direction as measured by X-ray photoelectron spectroscopy. In this graph, the ordinate indicates the ratio of the atomic concentration of each element (atomic %), and the abscissa indicates the distance from the surface of the contact. The contact thus fabricated was next kept for 60 min at 500° C. in air, as a result of which the concentration distribution of each element changed as shown in FIG. 6b.

As shown in FIGS. 6a and 6b, even in the Ti/Mo/Au contact using Mo as the diffusion prevention layer, the oxidization of Ti cannot be prevented.

TABLE 2

| formation condition | Ti layer | Mo layer | Au layer |
| --- | --- | --- | --- |
| DC discharge | 0.8 A, 380 V | 0.2 A, 320 V | 0.2 A, 510 V |

TABLE 2-continued

| formation condition | Ti layer | Mo layer | Au layer |
|---|---|---|---|
| condition | | | |
| film deposition time | 15 sec | 1 min | 1 min |
| film thickness | 400 Å | 400 Å | 2000 Å |
| gas pressure | | 2 mTorr | |
| discharge gas | | Ar | |

SUMMARY OF THE INVENTION

Accordingly, an object of the present invention is to provide a heat-resistant ohmic contact formed on a semiconducting diamond layer capable of preventing the diffusion of Ti for obtaining an ohmic contact stable even at high temperatures, and a process for forming the same.

According to the first aspect of the present invention, there is provided a heat-resisting ohmic contact formed on a semiconducting diamond layer, comprising a contact Ti layer having a thickness of 10 to 70 Å and a carbide layer generated by the chemical reaction between the Ti layer and the semiconducting diamond layer.

According to the second aspect of the present invention, there is provided a process of forming a heat-resistant ohmic contact on a semiconducting diamond layer comprising the steps of: forming a Ti layer having a thickness of 10 to 70 Å on a semiconducting diamond layer, and then annealing the Ti layer to form a $TiC_{1-x}$ ($0 < X < 1$) carbide between the Ti layer and the semiconducting diamond layer.

BRIEF DESCRIPTION OF THE DRAWINGS

FIGS. 2a and 2b show the distribution of each element in the depth direction as measured by X-ray photoelectron spectroscopy for Ti/Au double layer contacts formed by the method of the examples of the present invention, wherein FIG. 2a shows the distribution before the annealing, and FIG. 2b shows the distribution after the annealing;

FIGS. 3a and 3b show the distribution of each element in the depth direction as measured by X-ray photoelectron spectroscopy for Ti/W/Au triple layer contacts formed by the method of the example of the present invention, wherein FIG. 3a shows the distribution before the annealing, and FIG. 3b shows the distribution after the annealing;

FIGS. 5a and 5b show the distribution of each element in the depth direction as measured by X-ray photoelectron spectroscopy for Ti/Au contacts formed under the conditions shown in Table 1, wherein FIG. 5a shows the distribution before the annealing and FIG. 5b shows the distribution after the annealing; and FIGS. 6a and 6b show the distribution of each element in the depth direction as measured by X-ray photoelectron spectroscopy for Ti/Mo/Au triple layer contacts in which Mo is incorporated as a diffusion prevention layer, wherein FIG. 6a shows the distribution before the annealing and FIG. 6b shows the distribution after the annealing.

DETAILED DESCRIPTION OF THE PREFERRED EMBODIMENTS

Prior to description of the preferred embodiments, there will be described the function of the present invention.

By annealing the Ti layer on the semiconducting diamond layer, a desirable ohmic contact can be formed. This is because the metal contact reacts with the diamond through the annealing, to form a carbide. In this case, a current is allowed to flow through the defect levels present at the interface. However, for a Ti layer having a thickness of less than 10Å, it is impossible to introduce a defect density sufficient for an ohmic contact. As a consequence, the Ti layer must be of a thickness of 10Å or more for fabrication of the ohmic contact.

Figure 1:
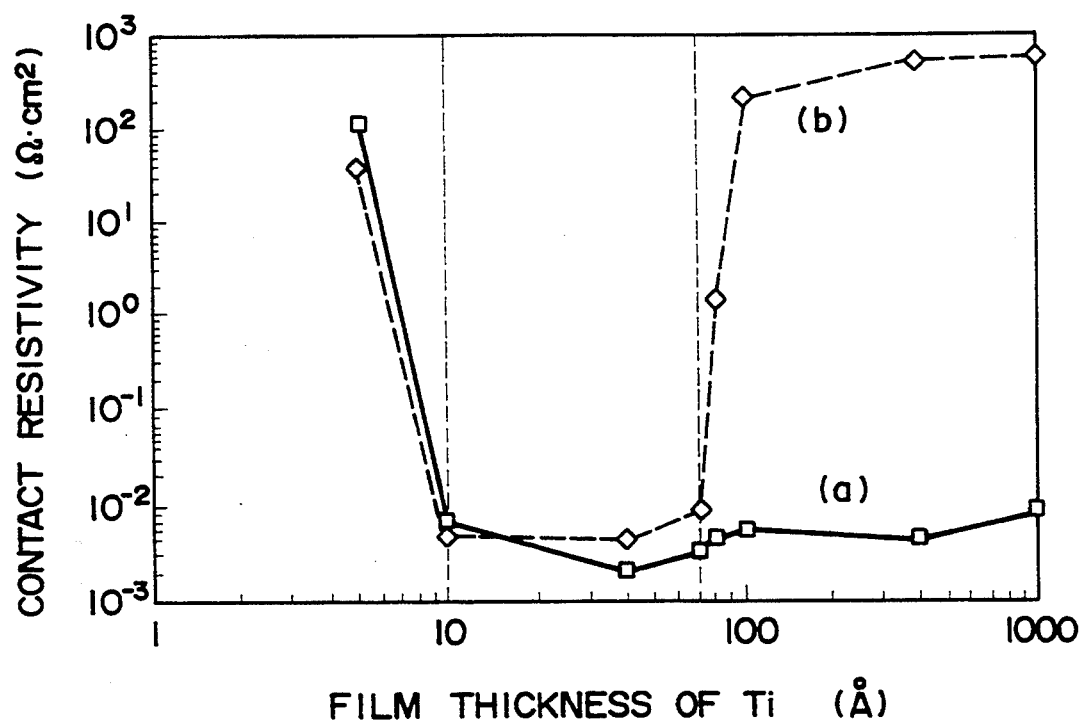
FIG. 1 shows the change in the contact resistivity of Ti/Au double layer contacts, different in the thickness of the Ti film, formed by the method of the first example, wherein the solid line (a) shows the contact resistivity before the heating, and the dotted line (b) shows the contact resistivity after the heating.

On the other hand, excessive Ti must be eliminated since it causes diffusion and oxidation. FIG. 1 shows the change in the contact resistance of several Ti/Au contacts, different in the thickness of the Ti film, which have been fabricated under the conditions shown in the first example described later and then kept for 10 hrs at 500° C. in air. In this graph, the abscissa indicates the thickness of the Ti film used, and the ordinate indicates the contact resistivity. The solid line (a) shows the contact resistivity after the heating and the dotted line shows the contact resistivity before the heating. As can be seen in FIG. 1, the contact resistivity increases sharply when the Ti film thickness exceeds 70Å. This is because unreacted Ti remains after the formation of the carbide layer when the thickness of Ti exceeds 70Å, and is oxidized during the heating to form insulating $TiO_2$. Accordingly, it is necessary that the thickness of the Ti layer be 70Å or less. In addition, TiC formed through heating is more resistant to oxidation compared with Ti, and is stable at high temperatures.

In the present invention, ohmic contact is formed on semiconducting diamond layer using minimum amount of Ti (10 to 70Å) which chemically reacts with the diamond layer via annealing and govern its electrical characteristic. This makes it possible to form a stable and excellent ohmic contact.

The optimum thickness of the TiC layer according to the present invention is dependent on the service temperature, annealing condition, contact material and diffusion barrier material. In other words, the optimum thickness of the Ti layer of the contact of the present invention is determined such that the Ti layer can be carburized at the contact service temperature or the annealing temperature to retain the ohmic characteristics before oxygen or the Ti diffuses through the diffusion prevention layer and the Ti starts to be oxidized. Further, the Ti layer may be formed by general film formation methods such as thermal deposition or sputtering. In addition, for preventing diffusion after the deposition of the Ti, it is effective to form a multi-layer film by depositing refractory metal layer such as W, Mo, Pt, Mo/Au double layer film or W/Au double layer film, or refractory alloy such as Ti-W alloy, or a refractory compound such as TiC or TiN.

The present invention will be more clearly understood with reference to the following examples:

EXAMPLE 1

Diamond films were formed by micro-wave plasma CVD. A $CH_4$ gas diluted with hydrogen was used as the reaction gas, and a $B_2H_6$ gas was used as the doping gas. The deposition conditions are shown in Table 3.

TABLE 3

| reaction gas | $CH_4$ (0.5%) |
|---|---|
| doping gas | $B_2H_6$ (0.5 ppm) |
| substrate temperature | 800° C. |
| gas pressure | 35 Torr |
| deposition time | 7 hr |
| substrate | Si |

A Ti/Au double layer film was formed on the above semiconducting diamond film by magneton sputtering. Namely, the chamber was evacuated to a pressure of $10^{-6}$ Torr, and Ar gas was allowed to flow at a flow rate of 10 sccm under a gas pressure of 2 mTorr. After the flow rate of Ar gas was stabilized, the film formation was performed under the conditions shown in Table 4. The thickness of the Ti layer was about 40Å. Subsequently, the contact thus formed was annealed for 20 min at 400° C. in a vacuum.

Figure 2A:
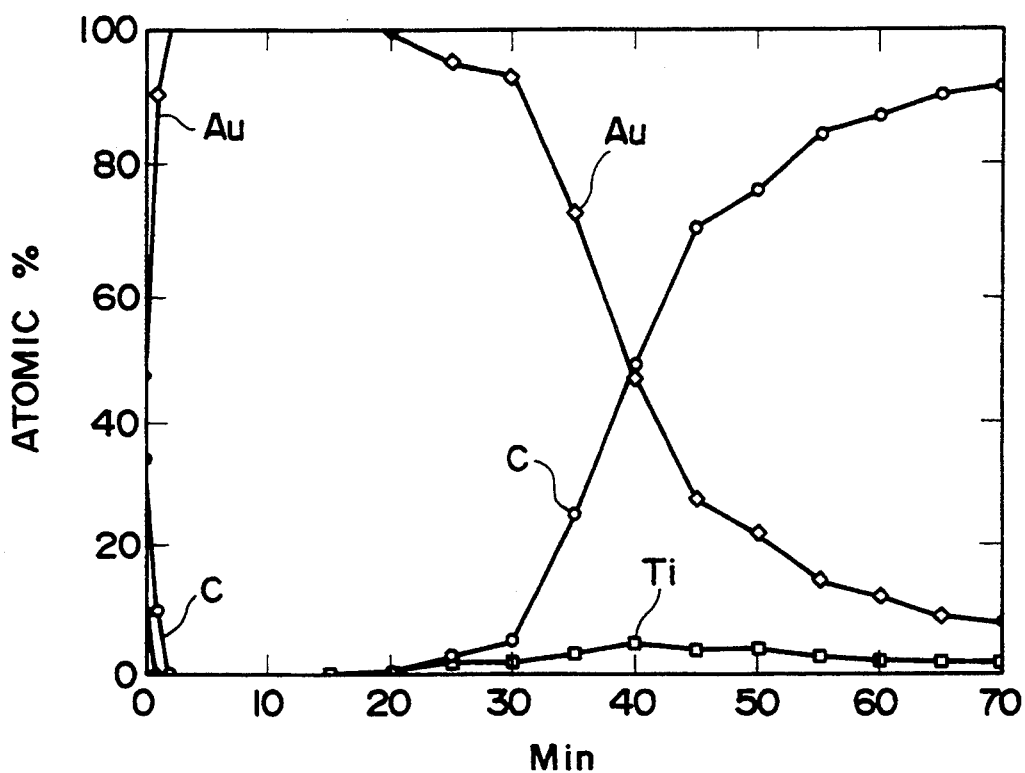

FIG. 2a shows the distribution of each element as measured by X-ray photoelectron spectroscopy. In this graph, the ordinate indicates the ratio of the atomic concentration of each element (atomic %), and the abscissa indicates the sputtering time corresponding to the distance from the surface of the contact.

Figure 2B:
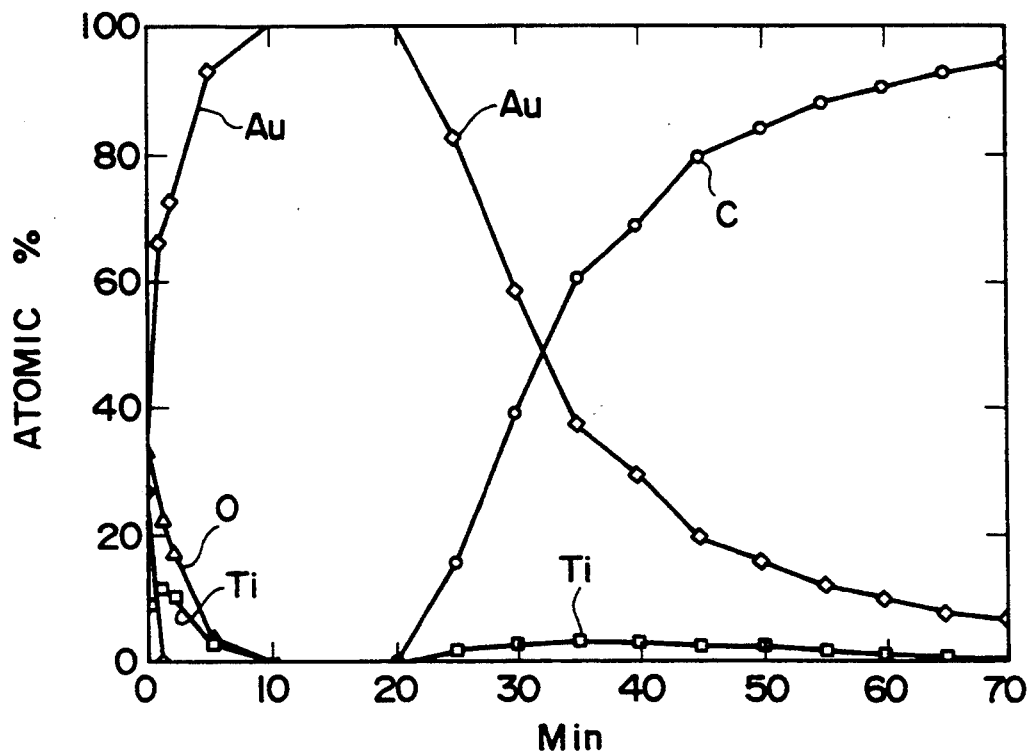

The sample was then kept for 1 hr at 500° C. in air. The distribution of each element thus obtained is shown in FIG. 2b. In addition, the thickness of the Ti layer was 40Å. As can be seen in this graph, Ti was not oxidized and did not diffuse, and the Ti layer remained unchanged on the surface of the diamond layer. Accordingly, the ohmic contact of the present invention is extremely effective as a heat-resistant electrode.

Further, a TLM pattern was fabricated by lithography using the ohmic contact of the present invention, and was measured for contact resistivity. The contact resistivity thus obtained was about $10^{-3}$ $\Omega cm^2$ and exhibited suitable ohmic characteristics. Thus, even during the heat treatment after formation of the contact, by using a Ti layer having a thickness of 10 to 70Å, oxidation of Ti can be prevented.

TABLE 4

| formation condition | Ti layer | Au layer |
|---|---|---|
| DC discharge condition | 0.2 A, 300 V | 0.2 A, 510 V |
| deposition time | 6 sec | 1 min |
| film thickness | 40 Å | 2000 Å |
| gas pressure | 2 mTorr | |
| discharge gas | Ar | |

Figure 3A:
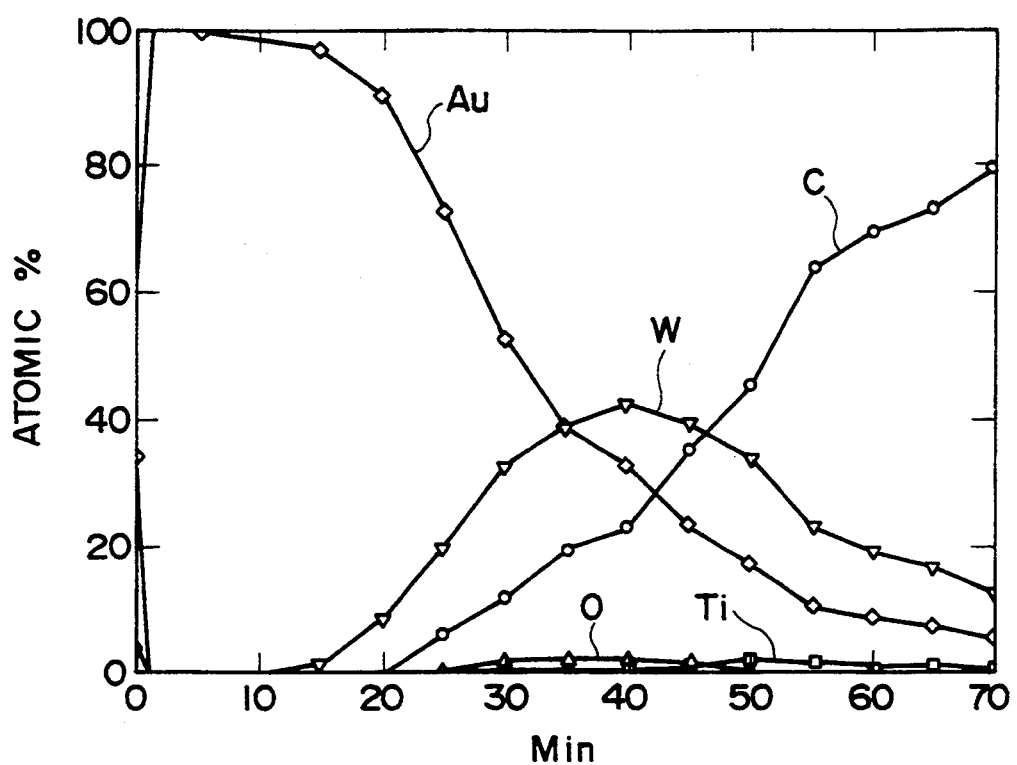

The diamond film used in this example was formed in the same manner as in Example 1. Further, in this example, a refractory W layer was formed as a diffusion barrier. Just as in Example 1, by magnetron sputtering a Ti/W/Au triple layer film was formed on the above synthesized diamond film. Namely, the chamber was evacuated to a pressure of $10^{-6}$ Torr, and Ar gas was allowed to flow at a flow rate of 10 sccm under a gas pressure of 2 mTorr. After the flow rate of Ar gas was stabilized, the film formation was performed under the conditions shown in Table 5. The film thickness of the Ti layer was the same as in Example 1, that is, about 40Å. The contact thus formed was annealed at 400° C. The distribution of each element in the contact thus obtained is shown in FIG. 3a. In this graph, the ordinate indicates the atomic concentration of each element (atomic %), and the abscissa indicates the distance from the surface of the contact. In addition, the thickness of the Ti layer is 40Å.

Figure 3B:
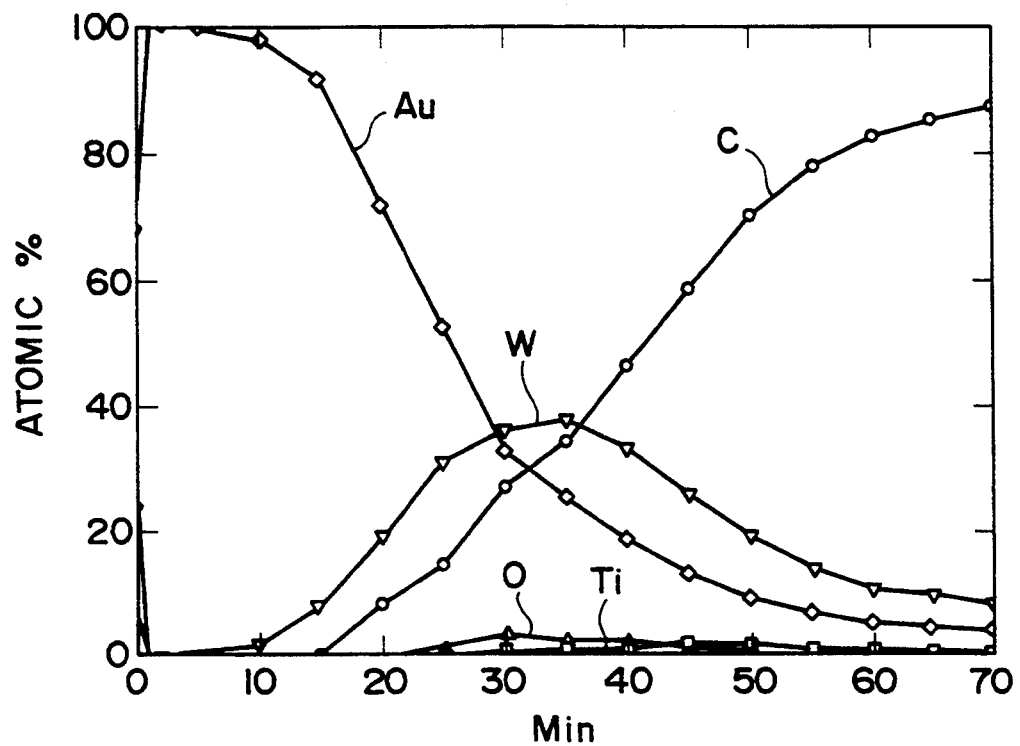
Figure 4A:
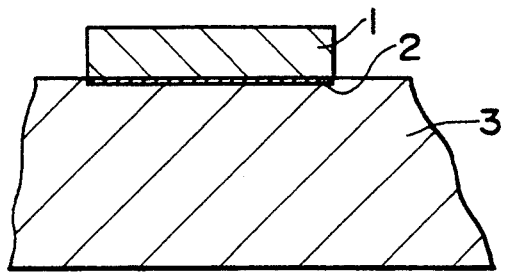
FIG. 4a typical cross sectional view of an ohmic contact wherein Ta, Ti, Mo or other element liable to form a carbide is used as the contact material.
Figure 4B:
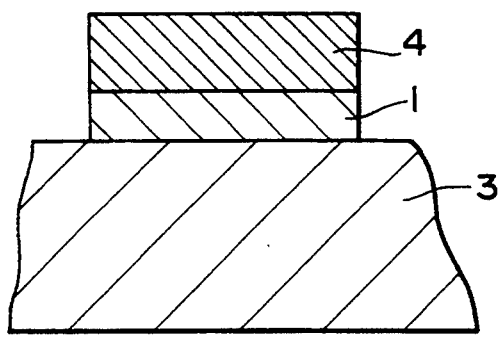
FIG. 4b is a typical cross sectional view of a Ti/Au double layer contact wherein an Au layer is formed as an oxidation prevention layer.
Figure 4C:
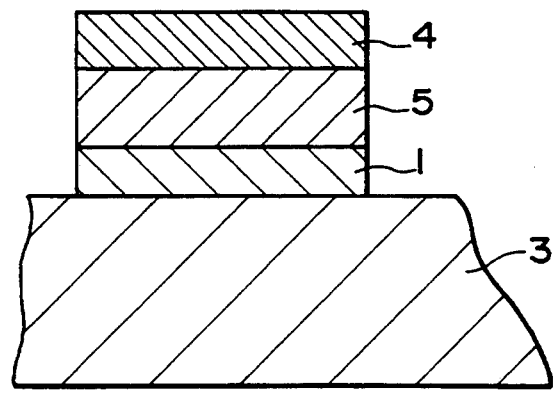
FIG. 4c is a typical cross sectional view of a Ti/Mo/Au triple contact wherein an Mo/Au double layer film is formed as an oxidation prevention layer.
Figure 5A:
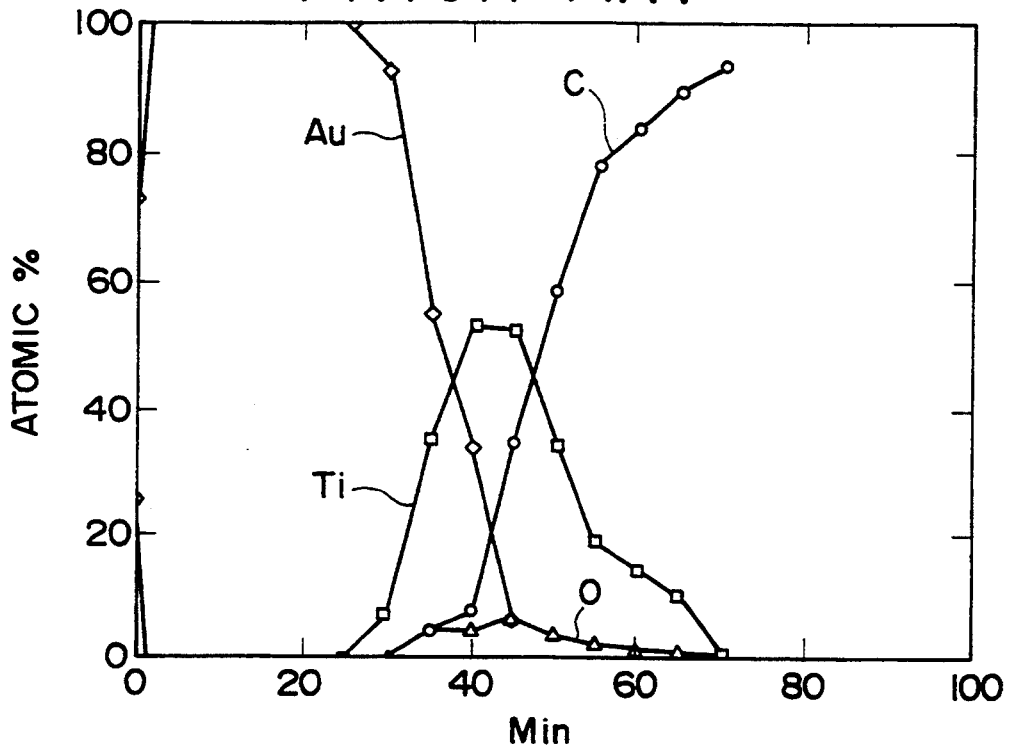
Figure 5B:
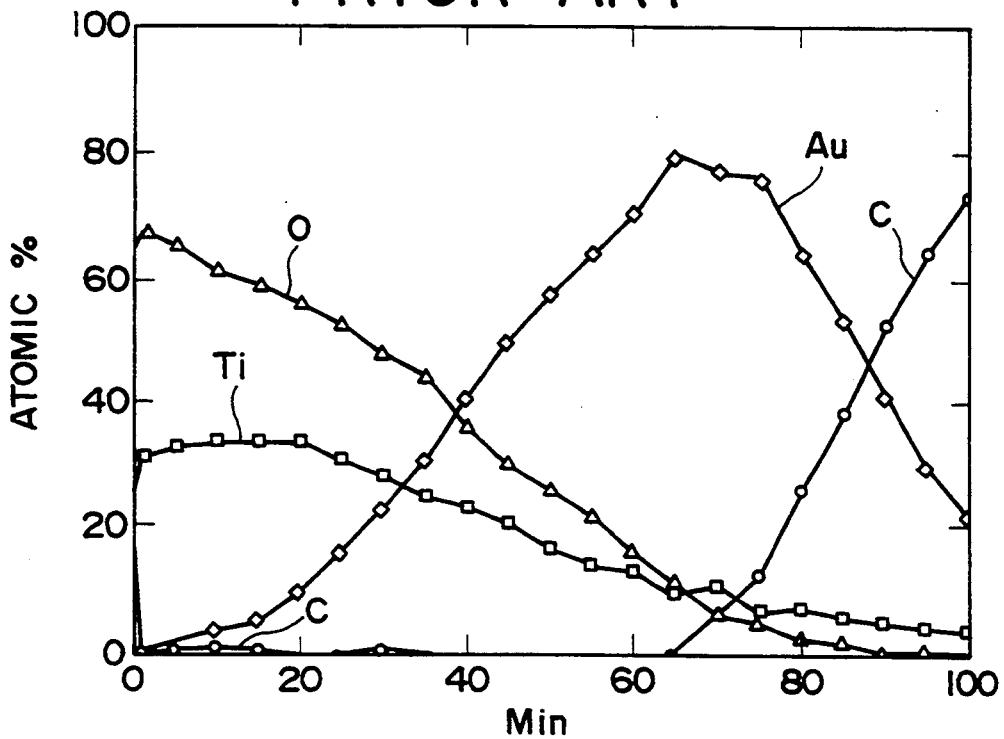
Figure 6A:
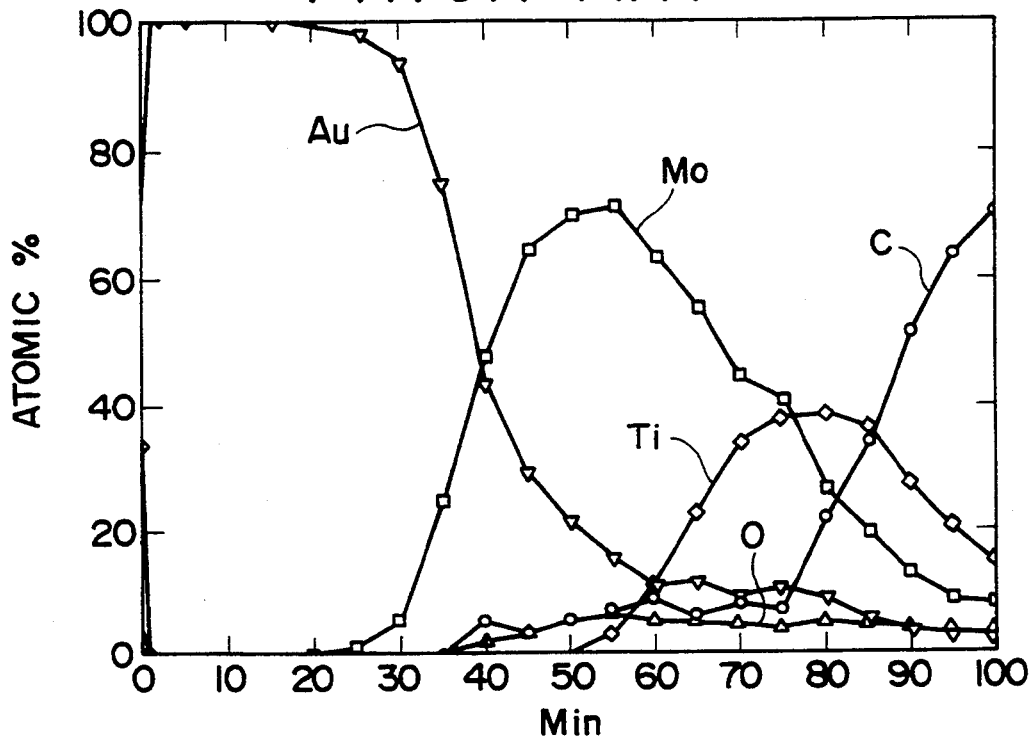
Figure 6B:
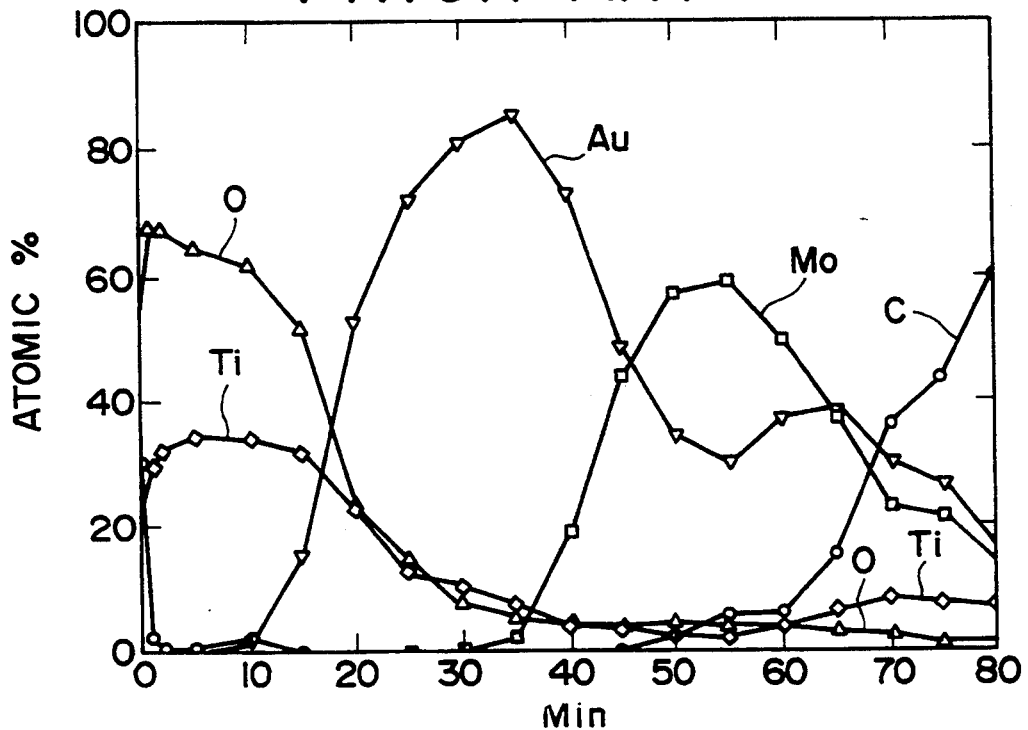

The sample was next annealed at 500° C. in air. The result is shown in FIG. 3b. As can be seen from this graph, it was possible to prevent the oxidation and the diffusion of Ti. This shows that the insertion of W as a diffusion barrier is effective in suppressing the diffusion of Ti and obtaining a contact stable at high temperatures.

As described above, it is effective to form a multilayer film as an oxidation prevention film by deposition of a refractory metal such as W, Mo, Pt, Mo/Au or W/Au, a refractory alloy such as Ti/W, or a refractory compound such as TiC or TiN.

TABLE 5

| formation condition | Ti layer | Mo layer | Au layer |
|---|---|---|---|
| DC discharge condition | 0.2 A, 300 V | 0.2 A, 310 V | 0.2 A, 510 V |
| film deposition time | 6 sec | 1 min | 1 min |
| film thickness | 40 A | 400 A | 2000 A |
| gas pressure | | 2 mTorr | |
| discharge gas | | Ar | |

As described above, according to the present invention, it is possible to obtain heat-resistant ohmic contacts which can be used even at high temperatures.

We claim:
1. A device comprising:
   a semiconducting diamond layer; and
   a carburized titanium layer on said semiconducting diamond layer;
   wherein said carburized titanium layer has a thickness of 10 to 70 Å.
2. The device of claim 1 further comprising a diffusion prevention layer on said titanium layer.
3. The device of claim 2 wherein said diffusion prevention layer is a layer consisting of at least one refractory material.
4. The device of claim 3 wherein said refractory material is selected from the group consisting of metals W, Mo, Pt and Ta, alloy Ti-W, and compounds TiC and TiN.

* * * * *

UNITED STATES PATENT AND TRADEMARK OFFICE
CERTIFICATE OF CORRECTION

PATENT NO. : 5,436,505
DATED : July 25, 1995
INVENTOR(S) : Kazushi HAYASHI, et al.

It is certified that error appears in the above-indentified patent and that said Letters Patent is hereby corrected as shown below:

On the title page, Item [54] and Column 1, Lines 2-3, the title should read:

--HEAT-RESISTING OHMIC CONTACT ON SEMICONDUCTING DIAMOND LAYER--

Signed and Sealed this

Third Day of October, 1995

Attest:

BRUCE LEHMAN

Attesting Officer     Commissioner of Patents and Trademarks